(12) United States Patent
Kobayashi

(10) Patent No.: US 6,278,156 B1
(45) Date of Patent: Aug. 21, 2001

(54) DIELECTRIC SEPARATE TYPE SEMICONDUCTOR DEVICE

(75) Inventor: Kenya Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/191,389

(22) Filed: Nov. 12, 1998

(30) Foreign Application Priority Data

Nov. 12, 1997 (JP) .................................................. 9-310886

(51) Int. Cl.[7] .............................................. H01L 31/0392
(52) U.S. Cl. ........................... 257/347; 257/348; 257/501
(58) Field of Search ................................. 257/347, 348, 257/351, 343, 350, 502, 501, 500, 395

(56) References Cited

U.S. PATENT DOCUMENTS 6,104,078 * 8/2000 Iida et al. .............................. 257/524
6,130,458 * 10/2000 Takagi et al. ......................... 257/351

FOREIGN PATENT DOCUMENTS

| 4275450 | 10/1992 | (JP) . |
| 5-067730 | 3/1993 | (JP) . |
| 6-196550 | 7/1994 | (JP) . |
| 7-226503 | 8/1995 | (JP) . |
| 8-64687 | 3/1996 | (JP) . |
| 10-144880 | 5/1998 | (JP) . |
| 11-176760 | 7/1999 | (JP) . |

* cited by examiner

Primary Examiner—Steven Loke
Assistant Examiner—Douglas W. Owens
(74) Attorney, Agent, or Firm—Ostrolenk, Faber, Gerb & Soffen

(57) ABSTRACT

An SOI substrate is formed by bonding first and second semiconductor substrates of p⁻ type through an insulating film interposed in between the substrates. In an SOI layer of a p type at the surface side of the two, a trench isolation region is formed for selecting elements so as to enclose an element forming region by burying a trench made of an oxide film. A MOS transistor having p⁺ type drain diffusion layer and p⁻ type drain diffusion layer is formed in this element forming region isolated by a dielectric region. A same potential is applied to an electrode connected to the p⁺ diffusion layer provided outside of the element forming region enclosed by the trench isolation region, and the drain diffusion layer. As a result, without forming an electrode on the back side of the SOI substrate, deterioration of withstand voltage of elements can be prevented.

7 Claims, 3 Drawing Sheets

DIELECTRIC SEPARATE TYPE SEMICONDUCTOR DEVICE

BACKGROUND OF THE INVENTION

1. Field of the Invention

The present invention relates to a dielectric separate type semiconductor device aiming at a higher withstand voltage of semiconductor elements isolated by a dielectric region.

2. Description of the Related Art

In the field of integrated circuits containing semiconductor elements handling high voltage and large current, or so-called power IC and high withstand voltage IC, in order to avoid mutual effects of actions of individual elements, it is effective to separate the elements by means of a dielectric. Such examples include, among others, an SOI substrate in which two silicon substrates are bonded together through an insulating film, bonded firmly, and a silicon layer of a desired thickness is formed by polishing, and a SIMOX substrate in which oxygen ions are injected into a silicon substrate to be treated at high temperature, and a silicon dioxide film (hereinafter called an oxide film) is formed at a position of a specific depth from the surface. In such SOI substrates and SIMOX substrates, in order to separate the elements further in the lateral direction, another insulator region is formed to enclose the elements and reach the insulating film inside the substrate, thereby realizing an IC in which individual element regions are completely isolated by dielectric materials.

On the other hand, in the SOI substrate, by the insulating film formed inside (hereinafter called a buried insulating film), the substrate face side, that is, the element forming region, and the substrate back side are electrically isolated, but in order to hold the withstand voltage of an element, it is generally known to fix the potential of the substrate.

An example of high withstand voltage elements formed on an SOI substrate is described below. FIG. 1 is a simplified plan view of a MOSFET isolated by a dielectric region. In an element forming region 20 enclosed by a trench isolation region 4, a drain field 1, a source field 2, and a gate polysilicon film 3 are disposed, and in order to obtain a high withstand voltage, the drain field 1 is placed at a position remote from the edge of the gate polysilicon film 3.

FIG. 2 is a sectional view along line A—A of the MOSFET shown in FIG. 1, showing together a mode of depletion region when an inverse bias is applied between the drain and source. In an SOI layer 16 of an SOI substrate 17 consisting of a first silicon substrate (p⁻ type) 14, a buried oxide film layer 12, and a second silicon substrate (p⁻ type) 15, a P channel MOSFET is formed. The SOI layer 16 is isolated into elements by a trench isolation region 4 in which an element isolating oxide film 13 is buried, and a p⁻ drain diffusion layer 10, a p⁺ source diffusion layer 6, and an n⁺ back gate diffusion layer 7 are formed in a n⁻ diffusion layer 11 reaching down to the buried oxide film 12, and further a p⁺ drain diffusion layer 5 is formed in the p⁻ drain diffusion layer 10. Moreover, through a gate oxide film 9, a gate polysilicon film 3 is formed so as to ride on a field oxide film 8.

In such a P channel MOSFET, the withstand voltage between the source and drain is determined by the junction withstand voltage between the p⁻ drain diffusion layer 10 and n⁻ diffusion layer 11, but by applying the same bias as in the drain to the SOI substrate back side 19, a higher withstand voltage than the junction withstand voltage may be realized. More specifically, setting the drain electrode (not shown) connected to the p⁺ drain diffusion layer 5 and the back electrode (not shown) connected to the SOI substrate back side 19 at the ground potential, when a positive potential is applied to the source electrode (not shown) connected between the p⁺ source diffusion layer 6 and n⁺ back gate diffusion layer 7, and the gate electrode (not shown) connected to the gate polysilicon film 3, a depletion layer spreads in the junction of the p⁻ drain diffusion layer 10 and n⁻ diffusion layer 11, and a diffusion layer also spreads in the n⁻ diffusion layer 11 on the buried oxide film 12. By further raising the potential, the two depletion layers are joined together, and a depletion region 18 is formed. Thus, as the depletion layers are joined, the electric field at the junction of the p⁻ drain diffusion layer 10 and n⁻ diffusion layer 11 is alleviated, so that a higher withstand voltage than the intrinsic junction withstand voltage is realized.

However, in the conventional high withstand voltage elements, it is required to apply a ground potential to the SOI substrate back side. A silicon chip forming an IC is usually sealed with a resin, and is processed so that terminals connected to the electrodes on the silicon chip are drawn out to the outside of the resin, and in this case terminals connected to the back side of the silicon chip are required. In the case of an ordinary mold package, it is possible by connecting the silicon chip back side and lead frame electrically by using a conductive material, and taking out the terminals outside of the resin. Recently, however, as the electronic appliances are becoming smaller in size and lighter in weight, the IC can be mounted by various mounting methods such as chip on board (COB) and chip on film (COF), and terminals connected to the chip back side cannot be always provided easily. Nevertheless, in the structure of such conventional high withstand voltage elements, the withstand voltage of elements deteriorates unless a ground potential is applied to the SOI substrate back side.

SUMMARY OF THE INVENTION

It is an object of the invention to present a dielectrically isolated type semiconductor device capable of preventing deterioration of withstand voltage of elements without forming an electrode on the SOI substrate back side, and obtaining a high withstand voltage without forming an electrode on the SOI substrate back side.

The dielectrically isolated type semiconductor device according to the present invention is a dielectrically isolated type semiconductor device laminating plural elements mutually isolated by a dielectric region, on the surface of an SOI substrate having the substrate face side and substrate back side insulated and isolated by means of a buried insulating film, comprising a diffusion layer of a first conductive type isolated by the dielectric region, a diffusion layer of a second conductive type formed more thinly on the surface of the diffusion layer of the first conductive type, and an electrode provided in a region adjacent to the diffusion layer of the first conductive type across the dielectric region, in which the same potential as in the diffusion layer of the second conductive type is applied to the electrode when applying an inverse bias to the junction of the diffusion layer of the second conductive type.

In this dielectrically isolated type semiconductor device, the region to which the electrode is connected can be further isolated by the dielectric region from the outside region.

Another dielectrically isolated type semiconductor device of the invention comprises an SOI layer of a second conductive type at the face side of the SOI substrate composed by bonding first and second semiconductor substrates of the second conductive type with an insulating film placed between the two, a trench isolation region for isolating elements in a manner to enclose an element forming region by burying a trench made of the insulating film in this SOI layer of the second conductive type, semiconductor elements having a diffusion layer of the second conductive type formed in the element forming region, and an electrode formed outside of the element forming region enclosed by the trench isolation region, in which the same potential is applied to the diffusion layer of the second conductive type and the electrode.

In this dielectrically isolated type semiconductor device, the semiconductor element is, for example, a MOS transistor, and in this case a diffusion layer of a first conductive type is formed in the element forming region, and the diffusion layer of the second conductive type is a drain diffusion layer formed on the surface of this diffusion layer of the first conductive type. The semiconductor element has a source diffusion layer of the second conductive type and a back gate diffusion layer of the first conductive type formed on the surface of the diffusion layer of the first conductive type, and a gate electrode layer formed on the substrate between the drain diffusion layer and the source diffusion layer.

In the present invention, by forming an outside diffusion layer of the second conductive type on the surface of an SOI layer of the second conductive type on the outside across the trench isolation region of the element isolation region, the electrode can be connected to the outside diffusion layer of the second conductive type. Or, by forming a second trench isolation region so as to enclose the region in which the electrode on the outside of the trench isolation region is connected, the region in which the electrode is connected may be further isolated from its outside region by a dielectric region.

Further in the present invention, a high withstand voltage is obtained by applying the same potential as in the diffusion layer of the second conductive type to the electrode provided in the SOI layer adjacent across the dielectric region. Hence, it is not necessary to form an electrode on the back side of the SOI substrate. The potential to be applied to the diffusion layer of the second conductive type and the electrode is, for example, ground. By forming the second trench isolation region to enclose further the region in which the electrode is connected, the region to be set in this ground is prevented from spreading over to the entire semiconductor substrate.

As described herein, according to the present invention, in the dielectrically isolated type semiconductor device integrating plural elements mutually isolated by an electrode on an SOI substrate, without forming an electrode on the back side of the SOI substrate and applying a ground potential, the same high withstand voltage as when an electrode is provided on the back side of the SOI substrate is obtained. Therefore, the present invention does not require terminals connected to the back side of the silicon chip, and when mounting the IC, it is enough to draw out the terminals from the face side of the silicon chip only, and the application range of the mounting method of the semiconductor device is extended.

DESCRIPTION OF THE PREFERRED EMBODIMENTS

Figure 1:
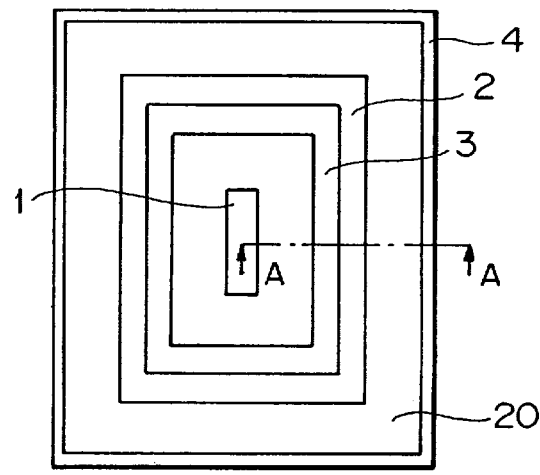
FIG. 1 is a plan view showing a conventional MOSFET isolated by a dielectric region.
Figure 2:
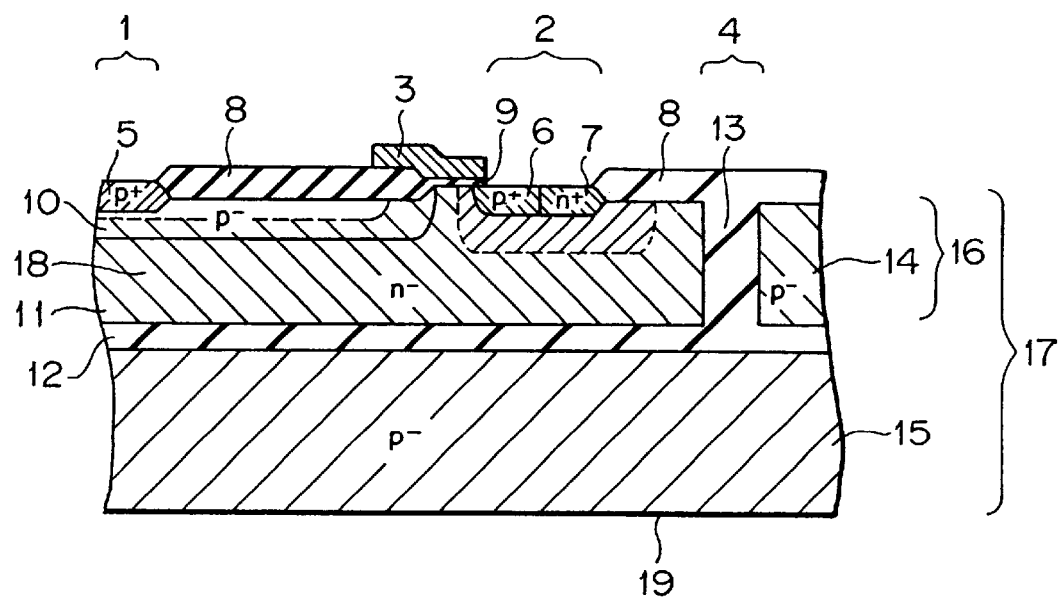
FIG. 2 is a sectional view along line A—A of the conventional MOSFET shown in FIG. 1.
Figure 3:
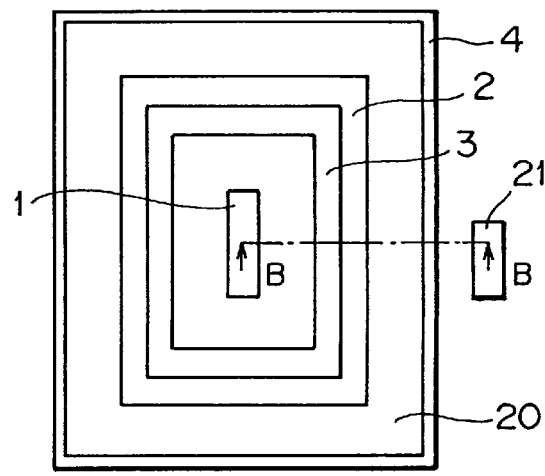
FIG. 3 is a plan view showing a MOSFET isolated by a dielectric region according to a first embodiment of the present invention.
Figure 4:
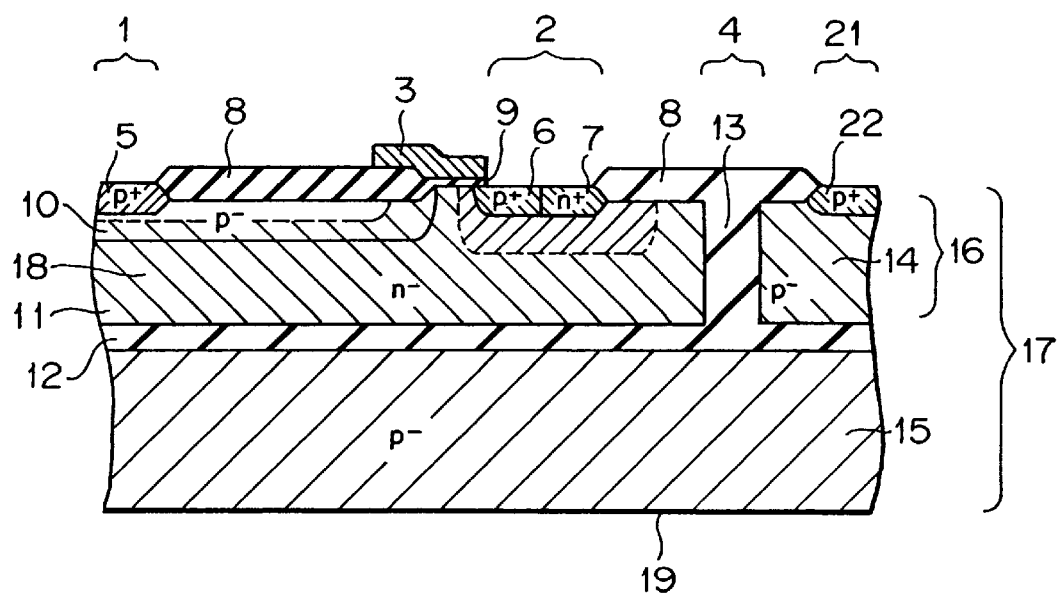
FIG. 4 is a sectional view along line B—B of the MOSFET shown in FIG. 3.

Preferred embodiments of the present invention are specifically described below while referring to the accompanying drawings. FIG. 3 shows a dielectrically isolated type semiconductor device according to a first embodiment of the present invention, and FIG. 4 is a sectional view along line B—B in FIG. 3. This dielectrically isolated type semiconductor device is a MOSFET separated by a dielectrically isolated region.

As shown in FIG. 3, a drain field 1, a source field 2, and a gate polysilicon film 3 are disposed in an element forming region 20 enclosed by a trench isolation region 4, and the drain field 1 is at a position remote from the edge of the gate polysilicon film 3 in order to obtain a high withstand voltage. Outside of the trench isolation region 4, moreover, an element forming region outer field 21 is disposed.

FIG. 4 shows a mode of depletion region when an inverse bias is applied between the drain and source. A P channel MOSFET is formed on an SOI layer 16 of an SOI substrate 17 comprising a first silicon substrate ($p^-$ type) 14, a buried oxide layer 12, and a second silicon substrate($p^-$ type) 15. The SOI layer 16 has elements isolated by the trench isolation region 4 in which an element isolation oxide film 13 is buried. On the surface of an $n^-$ diffusion layer 11 reaching down to the buried oxide film 12, a $p^-$ drain diffusion layer 10, $p^+$ source diffusion layer 6, and $n^+$ back gate diffusion layer 7 are formed, and further a $p^+$ drain diffusion layer 5 is formed on the surface of the $p^-$ drain diffusion layer 10. Further, through a gate oxide film 9, a polysilicon film 3 is formed so as to ride on a field oxide film 8. Across the trench isolation region 4, moreover, an external $p^+$ diffusion layer 22 is formed on the surface of the first silicon substrate 14 on its outside.

The operation the thus constituted MOSFET is described below. By applying a ground potential to a drain electrode (not shown) connected to the $p^+$ drain diffusion layer 5 of the drain field 1, and an external electrode (not shown) connected to the external $p^+$ diffusion layer 22 of the element forming region outer field 21, and a positive potential to a source electrode (not shown) connected to the $p^+$ source diffusion layer 6 of the source field 2 and $n^+$ back gate diffusion layer 7, and a gate electrode (not shown) connected to the gate polysilicon film 3, a depletion layer spreads in a junction of the $p^-$ drain diffusion layer 10 and $n^-$ diffusion layer 11, and a depletion layer also spreads in the $n^-$ diffusion layer 11 on the buried oxide film 12. Further, by raising the potential of the source electrode and gate electrode, the two depletion layers are linked, and a depletion region 18 is formed. By such linking of the depletion layers, as in the prior art, by the same action and effect as in the method of applying a ground potential to the back side of the SOI substrate, the electric field is alleviated in the junction between the $p^-$ drain diffusion layer 10 and $n^-$ diffusion layer 11, so that a higher withstand voltage than the junction withstand voltage is realized.

This phenomenon is further described below. Since the source electrode (not shown) has a high positive potential, a high positive potential is also present in the vicinity of the element isolation oxide film 13 of the n⁻ diffusion layer 11, and the potential declines in proportion to the distance from the n⁺ back gate diffusion layer 7. Since the external electrode (not shown) has a ground potential, the entire body of the first silicon substrate (p⁻ type) 14 outside of the region isolated by the element isolation oxide film 13 has also a ground potential, and hence there is a large potential difference on both sides of the element separation oxide film 13. Besides, since the specific dielectric constant of silicon dioxide is about one-third or less that of silicon, in this state, the element isolation oxide film 13 is responsible for the majority of the voltage of the potential difference. On the other hand, no electrode is connected to the back side 19 of the SOI substrate 17, being in a floating potential state, but in the vicinity of the buried oxide film 12 of the second silicon substrate (p⁻ type) 15 immediately beneath the n⁺ back gate diffusion layer 7 to which the source electrode (not shown) is connected, a potential close to the ground potential is generated by electrostatic induction through the buried oxide film 12. This is because the buried oxide film 12 is coupled in series to the element isolation oxide film 13, and the buried oxide film 12, same as the element isolation oxide film 13, is also responsible for the majority of the potential difference existing on both sides. Therefore, the same depletion region 18 as when the SOI substrate surface 19 is set at the ground potential is formed, so that the elements are higher in the withstand voltage.

Figure 5:
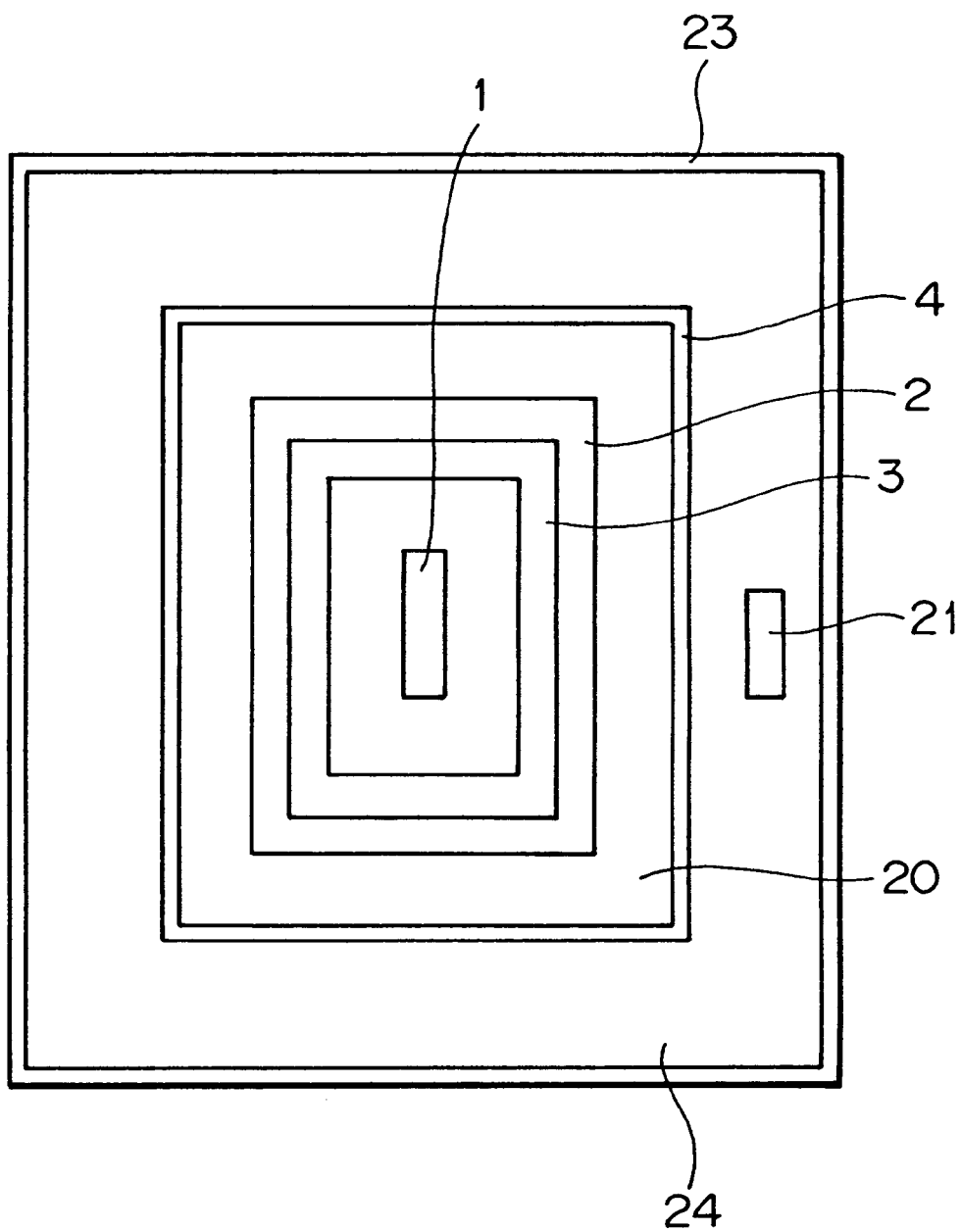
FIG. 5 is a plan view showing a MOSFET isolated by a dielectric region according to a second embodiment of the present invention.

FIG. 5 is a plan view showing a MOSFET isolated by a dielectric region according to a second embodiment of the invention. In FIG. 5, the same reference numbers are given to the same components found in FIG. 3 and FIG. 4, and their detailed description is omitted. A drain field 1, a source field 2, and a gate polysilicon 3 are disposed in an element forming region 20 enclosed by a trench isolation region 4, and the drain field 1 is disposed at a position remote from the edge of the gate polysilicon film 3 in order to obtain a high withstand voltage. Outside of the trench isolation region 4, moreover, another trench isolation region 23 is formed so as to enclose the trench isolation region 4. Between the two, an element forming region outer circumference isolation region 24 is disposed. In this element forming region outer circumference separation region 24, an element forming region outer field 21 is disposed.

In the thus constituted MOSFET of this embodiment, when a ground potential is applied by connecting an external electrode (not shown) to a p⁺ diffusion layer (not shown) formed in the element forming region outer field 21, different from the case of the first embodiment, the further outside area of the trench isolation region 23 is not set at ground potential, and therefore the entire body of the first silicon substrate (p⁻) 14 is not set at ground potential.

As explained herein, according to the present invention, in the dielectrically isolated seperate type semiconductor device integrating plural elements mutually isolated by a dielectric region on an SOI substrate, without forming an electrode on the back side of the SOI substrate to be set at ground potential, the same high withstand voltage as when an electrode is provided on the back side of the SOI substrate is obtained. Therefore, the present invention does not require terminals connected to the back side of the silicon chip, and when mounting the IC, it is enough to draw out the terminals from the face side of the silicon chip only, and the application range of the mounting method of the semiconductor device is extended.

What is claimed is:

1. A dielectrically isolated-type semiconductor device comprising:
   an SOI substrate having a substrate face side and a substrate back side, the face side and the back side being insulated and isolated by means of a buried insulating film, the back side being in a floating potential state, and
   a plurality of elements integrated on the face side of this SOI substrate and mutually isolated by a dielectric region, each of the plurality of elements including:
      a diffusion layer of a first conductive type isolated by said dielectric region,
      a diffusion layer of a second conductive type formed on the surface of the diffusion layer of the first conductive type,
      an outside diffusion layer of the second conductive type provided in a region outside the isolated region, and
      said diffusion layer of the second conductive type being set at the same potential as said outside diffusion layer of the second conductive type.

2. A dielectrically isolated-type semiconductor device according to claim 1, wherein the region in which said outside diffusion layer is formed is isolated by a second dielectric region.

3. A dielectrically isolated-type semiconductor device comprising:
   an SOI substrate having a face side and a back side, the back side being in a floating potential state,
   an SOI layer of a second conductive type at the face side of the SOI substrate formed by bonding first and second semiconductor substrates of the second conductive type by placing an insulating film between the two,
   a trench isolation region for isolating elements in a manner to enclose an element forming region by burying a trench made of the insulating film in this SOI layer of the second conductive type,
   a semiconductor element having a diffusion layer of the second conductive type formed in said element forming region,
   an outside diffusion layer formed outside of the element forming region enclosed by said trench isolation region,
   the outside diffusion layer being set to a same potential as said diffusion layer of the second conductive type in said semiconductor element.

4. A dielectrically isolated type semiconductor device according to claim 3, wherein said semiconductor element is a MOS transistor, having a diffusion layer of a first conductive type formed in said element forming region, and said diffusion layer of the second conductive type is a drain diffusion layer formed on the surface of this diffusion layer of the first conductive type.

5. A dielectrically isolated type semiconductor device according to claim 4, wherein said semiconductor element has a source diffusion layer of the second conductive type and a back gate diffusion layer of the first conductive type formed on the surface of said diffusion layer of the first conductive type, and a gate electrode layer formed on the substrate between said drain diffusion layer and said source diffusion layer.

6. A dielectrically isolated-type semiconductor device according to claim 3, further including a second trench isolation region so as to enclose the region in which said outside diffusion layer outside of said trench isolation region is formed, wherein the region in which said outside diffusion layer is formed is further isolated from said trench isolation region by a dielectric region.

7. A dielectric separate type semiconductor device comprising:
- an SOI substrate having a substrate face side and a substrate back side in a floating potential state, said substrate face side and said substrate back side being insulated and separated by means of a buried insulating film, and
- a plurality of elements integrated on the surface of said SOI substrate and mutually separated by a dielectric region, each of the plurality of elements including:
  - a first conductive type diffusion layer separated by said dielectric region,
  - a second conductive type diffusion layer formed on a surface of said first conductive type diffusion layer such that said second conductive type diffusion layer is thinner than said first conductive type diffusion layer, and
  - an electrode provided in a region adjacent to said first conductive type diffusion layer across said dielectric region, wherein when an inverse bias is applied to a junction of said second conductive type diffusion layer while the same potential as in the second conductive type diffusion layer is applied to said electrode, a depletion layer extending from said first conductive type diffusion layer on said buried insulating film and a depletion layer extending from said junction are connected to each other.

* * * * *